US006946712B2

(12) United States Patent
Asao

(10) Patent No.: US 6,946,712 B2
(45) Date of Patent: Sep. 20, 2005

(54) MAGNETIC MEMORY DEVICE USING SOI SUBSTRATE

(75) Inventor: Yoshiaki Asao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/288,366

(22) Filed: Nov. 6, 2002

(65) Prior Publication Data

US 2003/0086313 A1 May 8, 2003

(30) Foreign Application Priority Data

Nov. 7, 2001 (JP) ....................................... 2001-342289

(51) Int. Cl.[7] ................................................ H01L 29/76
(52) U.S. Cl. ........................ 257/395; 257/295; 257/315
(58) Field of Search ................................ 257/295, 347, 257/296, 30, 315, 138, 10, E27.112

(56) References Cited

U.S. PATENT DOCUMENTS

| | | | | |
|---|---|---|---|---|
| 5,838,608 A | | 11/1998 | Zhu et al. | |
| 6,097,625 A | | 8/2000 | Scheuerlein | |
| 6,172,903 B1 | * | 1/2001 | Nishimura | 365/158 |
| 6,178,074 B1 | * | 1/2001 | Gill | 360/324.2 |
| 6,518,588 B1 | * | 2/2003 | Parkin et al. | 257/3 |

FOREIGN PATENT DOCUMENTS

| | | |
|---|---|---|
| JP | 9-45074 | 2/1997 |

OTHER PUBLICATIONS

Roy Scheuerlein, et al. "A 10NS Read and Write Non–Volatile Memory Array Using a Magnetic Tunnel Junction and FET Switch in each Cell" ISSCC 2000 Technical Digest, 2000. pp. 128–129.

* cited by examiner

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

A magnetic memory device includes an SOI substrate having a first semiconductor layer, a first insulating film formed on the first semiconductor layer, and a second semiconductor layer formed on the first insulating film, an element isolation insulating film formed selectively in the second semiconductor layer extending from a surface of the second semiconductor layer with a depth reaching the first insulating film, a switching element formed in the second semiconductor layer, a magneto-resistive element connected to the switching element, a first wiring extending in a first direction at a distance below the magneto-resistive element, and a second wiring formed on the magneto-resistive element and extending in a second direction different from the first direction.

10 Claims, 14 Drawing Sheets

MAGNETIC MEMORY DEVICE USING SOI SUBSTRATE

CROSS-REFERENCE TO RELATED APPLICATIONS

This application is based upon and claims the benefit of priority from the prior Japanese Patent Application No. 2001-342289, filed Nov. 7, 2001, the entire contents of which are incorporated herein by reference.

BACKGROUND OF THE INVENTION

1. Field of the Invention

The present invention relates generally to a magnetic memory device and a method of manufacturing the memory device. This invention relates more particularly to a magnetic random access memory (MRAM) wherein a memory cell is formed using a magnetic tunnel junction (MTJ) element that stores information "1" or "0" on the basis of a tunnel magneto-resistive (TMR) effect.

2. Description of the Related Art

In these years, many kinds of memories that store information based on new principles have been proposed. One of them is a magnetic random access memory (MRAM) using a tunneling magneto-resistive (TMR) effect. The MRAM is disclosed, for example, in ISSCC2000 Technical Digest, p. 128, Roy Scheuerlein et al., "A 10 ns Read and Write Non-Volatile Memory Array Using a Magnetic Tunnel Junction and FET Switch in each Cell."

FIGS. 15A, 15B and 15C are cross-sectional views of a magnetic tunnel junction (MTJ) element of a prior-art magnetic memory device. The MTJ element used as a memory element of the MRAM will now be described.

As is shown in FIG. 15A, an MTJ element 31 has such a structure that an insulating layer (tunnel junction layer) 42 is interposed between two magnetic layers (ferromagnetic layers) 41 and 43. In the MRAM, the MTJ element 31 stores information "1" or "0". The information "1" or "0" is determined, depending on whether the directions of magnetization of the two magnetic layers 41 and 43 in the MTJ element 31 are parallel or anti-parallel. The term "parallel" in this context means that the directions of magnetization of two magnetic layers 41 and 43 are the same, and "anti-parallel" means that the directions of magnetization of two magnetic layers 41 and 43 are opposite to each other.

Specifically, when the directions of magnetization of two magnetic layers 41 and 43 are parallel, as shown in FIG. 15B, the tunnel resistance of the insulating layer 42 interposed between the two magnetic layers 41 and 43 takes a minimum value. This state corresponds to, for example, "1". On the other hand, when the directions of magnetization of two magnetic layers 41 and 43 are anti-parallel, as shown in FIG. 15C, the tunnel resistance of the insulating layer 42 interposed between the two magnetic layers 41 and 43 takes a maximum value. This state corresponds to, for example, "0".

Normally, an anti-ferromagnetic layer 103 is provided on one of the two magnetic layers 41 and 43. The anti-ferromagnetic layer 103 is a member for fixing the direction of magnetization of one magnetic layer 41, thus permitting easy rewriting of information by merely changing the direction of magnetization of the other magnetic layer 43 alone.

FIG. 16 shows MTJ elements arranged in a matrix in a prior-art magnetic memory device. FIG. 17 shows asteroid curves in the prior-art magnetic memory device. FIG. 18 shows MTJ curves in the prior-art magnetic memory device. The principle of the write operation for the MTJ element will now be described in brief.

As is shown in FIG. 16, MTJ elements 31 are arranged at intersections between write word lines 28 and bit lines (data select lines) 32, which are arranged to cross each other. A data write operation is performed by supplying a current to each of the write word lines 28 and bit lines 32 and setting the directions of magnetization of the MTJ elements 31 in a parallel state or an anti-parallel state, making use of magnetic fields produced by the current flowing in both lines 28 and 32.

For example, in the data write mode, the bit lines 32 are supplied with only a current I1 that flows in one direction, and the write word lines 28 are supplied with a current I2 that flows in one direction or a current I3 that flows in the other direction in accordance with data to be written. When the write word line 28 is supplied with the current I2 that flows in the one direction, the direction of magnetization of the MTJ element 31 is parallel ("1" state). On the other hand, when the write word line 28 is supplied with the current I3 that flows in the other direction, the direction of magnetization of the MTJ element 31 is anti-parallel ("0" state).

How the direction of magnetization of the MTJ element 31 is changed will now be described. When a current is supplied to a selected write word line 28, a magnetic field Hx occurs in a longitudinal direction, i.e. an Easy-Axis direction, of the MTJ element 31. When a current is supplied to a selected bit line 32, a magnetic field Hy occurs in a transverse direction, i.e. a Hard-Axis direction, of the MTJ element 31. As a result, a composite magnetic field of the Easy-Axis magnetic field Hx and lard-Axis magnetic field Hy acts on the MTJ element 31 located at the intersection of the selected write word line 28 and selected bit line 32.

In a case where the magnitude of the composite magnetic field of the Easy-Axis magnetic field Hx and Hard-Axis magnetic field Hy is in an outside region (hatched region) of asteroid curves indicated by solid lines in FIG. 17, the direction of magnetization of the magnetic layer 43 can be reversed. On the other hand, when the magnitude of the composite magnetic field of the Easy-Axis magnetic field Hx and Hard-Axis magnetic field Hy is in an inside region (blank region) of the asteroid curves, the direction of magnetization of the magnetic layer 43 cannot be reversed.

In addition, as indicated by solid and broken lines in FIG. 18, the magnitude of the Easy-Axis magnetic field Hx, which is necessary for varying the resistance value of the MTJ element 31, varies depending on the magnitude of the Hard-Axis magnetic field Hy. Making use of this phenomenon, the direction of magnetization of only the MTJ element 31 located at the intersection of the selected write word line 28 and selected bit line 32, among the arrayed memory cells, is altered, and thus the resistance value of the MTJ element 31 can be varied.

A variation ratio in resistance value of the MTJ element 31 is expressed by an MR (Magneto-Resistive) ratio. For example, if the magnetic field Hx is produced in the Easy-Axis direction, the resistance value of the MTJ element 31 varies, e.g. about 17%, compared to the state before the production of magnetic field Hx. In this case, the MR ratio is 17%. The MR ratio varies depending on the properties of the magnetic layer. At present, MTJ elements with an MR ratio of about 50% have successfully been obtained.

As has been described above, the direction of magnetization of the MTJ element 31 is controlled by varying each of the magnitudes of Easy-Axis magnetic field Hx and Hard-Axis magnetic field Hy and by varying the magnitude of the composite magnetic field of the fields Hx and Hy. In this manner, a state in which the direction of magnetization of the MTJ element 31 is parallel or a state in which the direction of magnetization of the MTJ element 31 is anti-parallel is created, and information "1" or "0" is stored.

FIG. 19 is a cross-sectional view of a prior-art magnetic memory device having a transistor. FIG. 20 is a cross-sectional view of a prior-art magnetic memory device having a diode. An operation of reading out information from the MTJ element will be described below.

Data read-out is effected by supplying a current to a selected MTJ element 31 and detecting the resistance value of the MTJ element 31. The resistance value is varied by applying a magnetic field to the MTJ element 31. The varied resistance value is read out by the following method.

In the example shown in FIG. 19, a MOSFET 64 is used as a switching element for data read-out. As is shown in FIG. 19, an MTJ element 31 is connected in series to a source/drain diffusion layer 63 of the MOSFET 64 in one cell. If the gate of the MOSFET 64, which is a chosen one, is turned on, a current path is formed through the following elements in the named order: a bit line 32, MTJ element 31, a lower electrode 30, a contact 29, second wiring 28, a contact 27, first wiring 26, a contact 25, and source/drain diffusion layer 63. Thus, the resistance value of the MTJ element 31, which is connected to the turned-on MOSFET 64, can be read out.

In the example of FIG. 20, a diode 73 is used as a switching element for data read-out. As is shown in FIG. 20, an MTJ element 31 is connected in series to a diode 73 within a cell, the diode 73 comprising a $P^+$ first diffusion layer 71 and an $N^-$ second diffusion layer 72. By adjusting a bias voltage so as to cause a current to flow to the diode 73, which is a chosen one, the resistance value of the MTJ element 31 connected to the diode 73 can be read out.

If the resistance value, which has been read out as described above, is low, it is determined that information "1" has been written. If the resistance value is high, it is determined that information "0" has been written.

In the prior-art magnetic memory device, the switching element is formed in a bulk substrate 61. In the magnetic memory device using the diode 73 as the switching device, as shown in FIG. 20, the $N^-$ second diffusion layer 72 is formed to be shallower than the bottom surface of a element isolation region 65 and the $P^+$ first diffusion layer 71 is formed in a surface portion of the $N^-$ second diffusion layer 72, thereby ensuring electrical isolation between the present cell and adjacent cells. Hence, when the diode 73 is to be formed using the bulk substrate 61, it is necessary to form a very shallow $P^+$ first diffusion layer 71. However, to form a shallow $P^+$ first diffusion layer 71 is difficult because of limitations in the process, and thus it is difficult to obtain uniform diode characteristics.

BRIEF SUMMARY OF THE INVENTION

According to a first aspect of the present invention, there is provided a magnetic memory device comprising: an SOI substrate having a first semiconductor layer, a first insulating film formed on the first semiconductor layer, and a second semiconductor layer formed on the first insulating film; an element isolation insulating film formed selectively in the second semiconductor layer extending from a surface of the second semiconductor layer with a depth reaching the first insulating film; a switching element formed in the second semiconductor layer; a magneto-resistive element connected to the switching element; a first wiring extending in a first direction at a distance below the magneto-resistive element; and a second wiring formed on the magneto-resistive element and extending in a second direction different from the first direction.

According to a second aspect of the invention, there is provided a method of manufacturing a magnetic memory device, comprising: forming an SOI substrate having a first semiconductor layer, a first insulating film formed on the first semiconductor layer, and a second semiconductor layer formed on the first insulating film; forming an element isolation insulating film selectively in the second semiconductor layer, the element isolation insulating film extending from a surface of the second semiconductor layer with a depth reaching the first insulating film; forming a switching element in the second semiconductor layer; forming a first wiring extending in a first direction; forming a magneto-resistive element connected to the switching element at a distance above the first wiring; and forming a second wiring on the magneto-resistive element, the second wiring extending in a second direction different from the first direction.

DETAILED DESCRIPTION OF THE INVENTION

Figure 1:
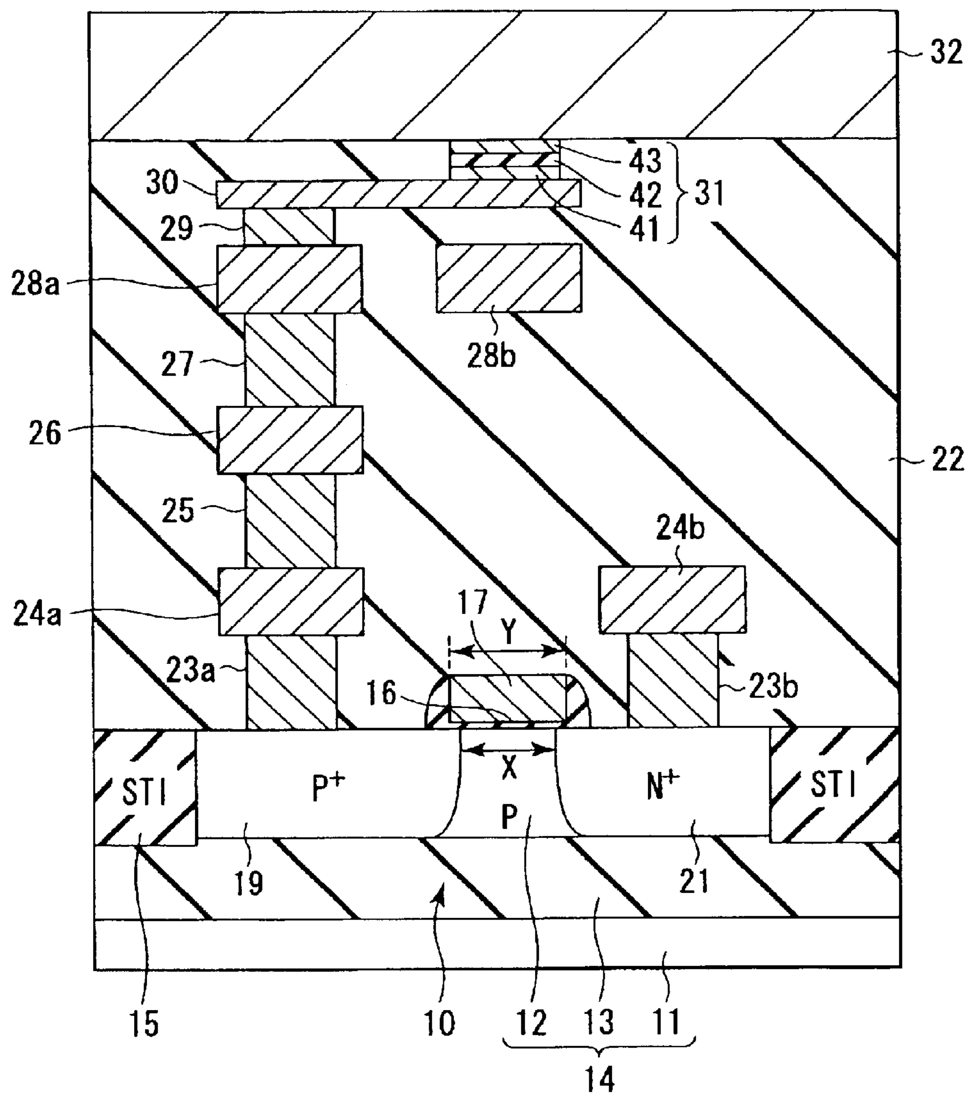
FIG. 1 is a cross-sectional view of a magnetic memory device according to a first embodiment of the present invention.

Embodiments of the present invention relate to magnetic random access memories (MRAMs) using as memory elements magnetic tunnel junction (MTJ) elements that make use of a tunneling magneto-resistive effect.

Embodiments of the invention will now be described with reference to the accompanying drawings. In the following descriptions referring to all Figures, common parts are denoted by like reference numerals.

[First Embodiment]

In a first embodiment of the invention, a diode is formed using an SOI (Silicon On Insulator) substrate, and a potential of a gate electrode is fixed.

Figure 2:
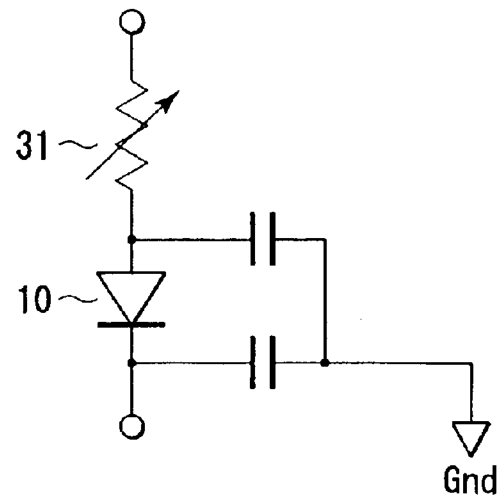
FIG. 2 is a circuit diagram of the magnetic memory device according to the first embodiment of the invention.

FIG. 1 is a cross-sectional view of a magnetic memory device according to the first embodiment of the invention. FIG. 2 is a circuit diagram schematically showing the magnetic memory device according to the first embodiment of the invention.

As is shown in FIGS. 1 and 2, the magnetic memory device according to the first embodiment employs an SOI substrate 14 comprising first and second semiconductor layers 11 and 12, and a buried oxide film 13 formed between the first and second semiconductor layers 11 and 12. In the SOI substrate 14, element isolation regions 15 of, e.g. an STI (Shallow Trench Isolation) structure are selectively formed from a surface of the second semiconductor layer 12 to a depth reaching the buried oxide film 13. The second semiconductor layer 12 surrounded by the buried oxide film 13 and element isolation regions 15 is formed in each cell. A gate electrode 17 is selectively formed over the second semiconductor layer 12 surrounded by these insulating films 13 and 15, with a gate insulating film 16 interposed. The gate electrode 17 is fixed at a predetermined potential, e.g. a ground potential. A $P^+$ first diffusion layer 19 is formed in that portion of the second semiconductor layer 12, which is near one end of the gate electrode 17, and an $N^+$ second diffusion layer 21 is formed in that portion of the second semiconductor layer 12, which is near the other end of the gate electrode 17. Thus, a so-called gate-control-type diode 10 is formed on the SOI substrate 14.

An MTJ element 31 is connected in series to the first diffusion layer 19 of diode 10 via first to fourth contacts 23*a*, 25, 27 and 29, first to third wirings 24*a*, 26 and 28*a* and a lower electrode 30. A bit line 32 is connected to the MTJ element 31. A write word line 28*b* formed of the third wiring is provided at a distance below the MTJ element 31.

A first contact 23*b* and a first wiring 24*b* are connected to the second diffusion layer 21 of diode 10. The first wiring 24*b* is connected to a peripheral circuit (not shown).

The MTJ element 31 comprises at least three layers, i.e., a magnetically fixed layer (magnetic layer) 41 whose magnetization direction is fixed, a tunnel junction layer (nonmagnetic layer) 42, and a magnetic recording layer (magnetic layer) 43 whose magnetization direction is reversible. This MTJ element 31 can have either a single tunnel junction structure comprising a single tunnel junction layer 42, or a double tunnel junction structure comprising two tunnel junction layers. Examples of the single and double tunnel junction structures will be described below.

Figure 3A:
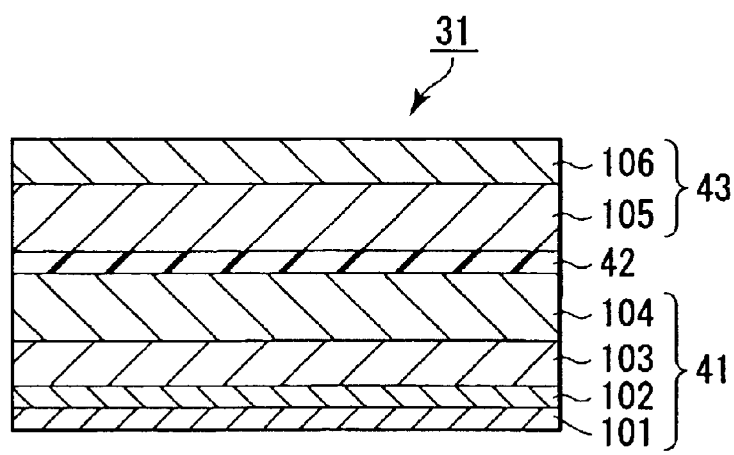
FIG. 3A and FIG. 3B are cross-sectional views showing an MTJ element of a single tunnel junction structure according to each of embodiments of the present invention.

An MTJ element 31 with the single tunnel junction structure, as shown in FIG. 3A, has a magnetically fixed layer 41, a tunnel junction layer 42 formed on this magnetically fixed layer 41, and a magnetic recording layer 43. The magnetically fixed layer 41 is formed by stacking a template layer 101, an initial ferromagnetic layer 102, an anti-ferromagnetic layer 103, and a reference ferromagnetic layer 104 in this order. The magnetic recording layer 43 is formed by stacking a free ferromagnetic layer 105 and a contact layer 106 in this order on the tunnel junction layer 42.

Figure 3B:
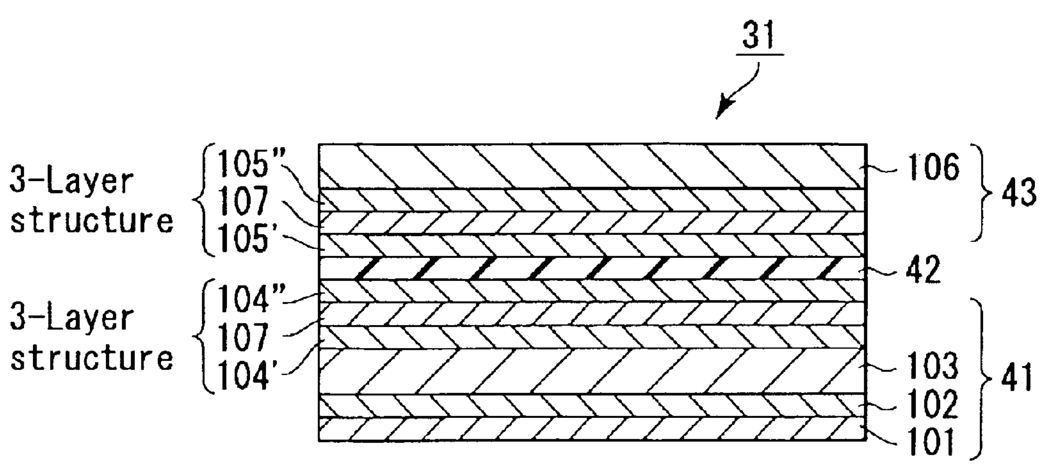

An MTJ element 31 with the single tunnel junction structure, as shown in FIG. 3B, has a magnetically fixed layer 41, a tunnel junction layer 42 formed on this magnetically fixed layer 41, and a magnetic recording layer 43. The magnetically fixed layer 41 is formed by stacking a template layer 101, an initial ferromagnetic layer 102, an anti-ferromagnetic layer 103, a ferromagnetic layer 104', a nonmagnetic layer 107, and a ferromagnetic layer 104" in this order. The magnetic recording layer 43 is formed by stacking a ferromagnetic layer 105', a nonmagnetic layer 107, a ferromagnetic layer 105", and a contact layer 106 in this order on the tunnel junction layer 42.

This MTJ element 31 shown in FIG. 3B has a three-layered structure made up of the ferromagnetic layer 104', the nonmagnetic layer 107, and the ferromagnetic layer 104" in the magnetically fixed layer 41, and another three-layered structure made up of the ferromagnetic layer 105', the nonmagnetic layer 107, and the ferromagnetic layer 105" in the magnetic recording layer 43. Accordingly, compared to the MTJ element 31 shown in FIG. 3A, this MTJ element 31 shown in FIG. 3B can more suppress the generation of magnetic poles inside the ferromagnetic layers and provide a cell structure more suited to micropatterning.

Figure 4A:
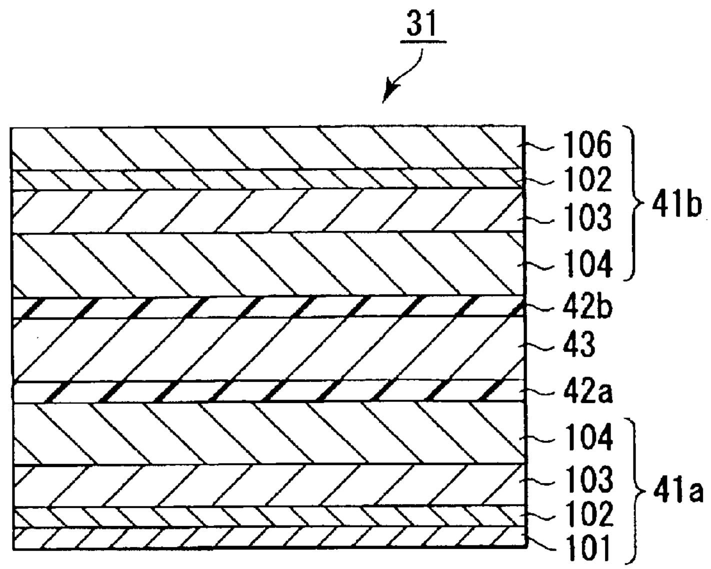
FIG. 4A and FIG. 4B are cross-sectional views showing an MTJ element of a double tunnel junction structure according to each of embodiments of the present invention.

An MTJ element 31 with the double tunnel junction structure, as shown in FIG. 4A, has a first magnetically fixed layer 41*a*, a first tunnel junction layer 42*a* formed on this first magnetically fixed layer 41*a*, a magnetic recording layer 43 formed on this first tunnel junction layer 42*a*, a second tunnel junction layer 42*b* formed on this magnetic recording layer 43, and a second magnetically fixed layer 41*b*. The first magnetically fixed layer 41*a* is formed by stacking a template layer 101, an initial ferromagnetic layer 102, an anti-ferromagnetic layer 103, and a reference ferromagnetic layer 104 in this order. The second magnetically fixed layer 41*b* is formed by stacking a reference ferromagnetic layer 104, an anti-ferromagnetic layer 103, an initial ferromagnetic layer 102, and a contact layer 106 in this order on the second tunnel junction layer 42*b*.

Figure 4B:
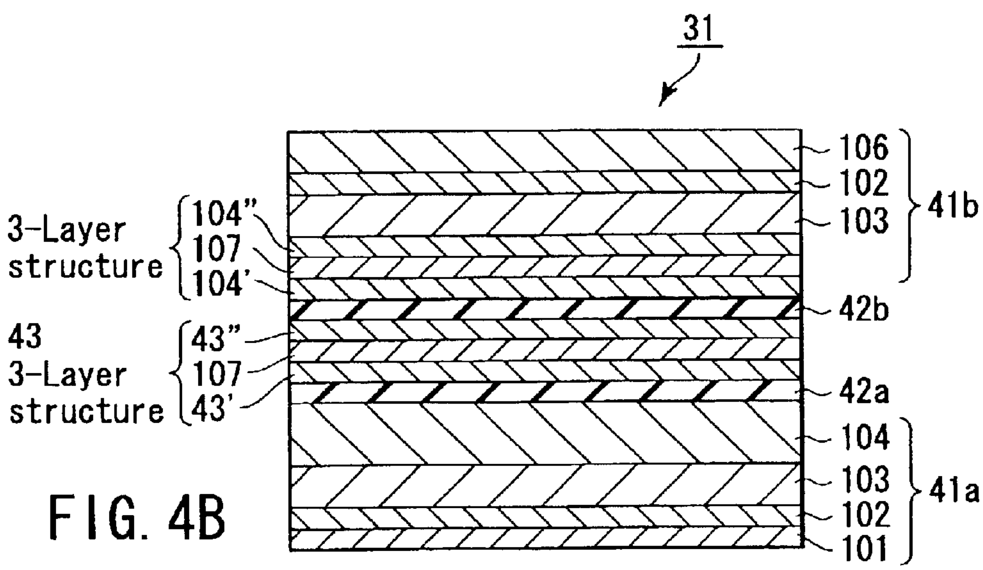

An MTJ element 31 with the double tunnel junction structure, as shown in FIG. 4B, has a first magnetically fixed layer 41*a*, a first tunnel junction layer 42*a* formed on this first magnetically fixed layer 41*a*, a magnetic recording layer 43, a second tunnel junction layer 42*b* formed on this magnetic recording layer 43, and a second magnetically fixed layer 41*b*. The first magnetically fixed layer 41*a* is formed by stacking a template layer 101, an initial ferromagnetic layer 102, an anti-ferromagnetic layer 103, and a reference ferromagnetic layer 104 in this order. The magnetic recording layer 43 is formed by stacking a ferromagnetic layer 43', a nonmagnetic layer 107, and a ferromagnetic layer 43" in this order on the first tunnel junction layer 42*a*. The second magnetically fixed layer 41*b* is formed by stacking a reference ferromagnetic layer 104', a nonmagnetic layer 107, a ferromagnetic layer 104", an anti-ferromagnetic layer 103, an initial ferromagnetic layer 102, and a contact layer 106 in this order on the second tunnel junction layer 42*b*.

This MTJ element 31 shown in FIG. 4B has a three-layered structure made up of the ferromagnetic layer 43', the nonmagnetic layer 107, and the ferromagnetic layer 43" forming the magnetic recording layer 43, and another three-layered structure made up of the ferromagnetic layer 104', the nonmagnetic layer 107, and the ferromagnetic layer 104" in the second magnetically fixed layer 41*b*. Accordingly, compared to the MTJ element 31 shown in FIG. 4A, this MTJ element 31 shown in FIG. 4B can more suppress the generation of magnetic poles inside the ferromagnetic layers and provide a cell structure more suited to micropatterning.

The double tunnel junction structure MTJ element 31 suffers less deterioration in the MR (Magneto Resistive) ratio (variation in resistance between "1" and "0" states) than the single tunnel junction structure MTJ element 31, when the same external bias is applied. Hence, the double tunnel junction structure MTJ element 31 can operate at a higher bias than the single tunnel junction structure MTJ element 31. This is advantageous in reading out data from a cell.

The single or double tunnel junction structure MTJ element 31 as described above is formed using the following materials.

Preferred examples of the material of the magnetically fixed layers 41, 41*a*, and 41*b* and the magnetic recording layer 43 are Fe, Co, Ni, and their alloys, magnetite having a large spin polarizability, oxides such as $CrO_2$ and $RXMnO_{3-y}$ (R; rare earth element, X; Ca, Ba, or Sr), and Heusler alloys such as NiMnSb and PtMnSb. Nonmagnetic elements such as Ag, Cu, Au, Al, Mg, Si, Bi, Ta, B, C, 0, N, Pd, Pt, Zr, Ir, W, Mo, and Nb can also be more or less contained in these magnetic substances, provided that ferromagnetism is not lost.

As the material of the anti-ferromagnetic layer 103 forming part of these magnetically fixed layers 41, 41*a*, and 41*b*, it is preferable to use Fe—Mn, Pt—Mn, Pt—Cr—Mn, Ni—Mn, Ir—Mn, NiO, or $Fe_2O_3$.

As the material of the tunnel junction layers 42, 42*a*, and 42*b*, it is possible to use various dielectric substances such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may be present in these dielectric substances.

Figure 5:
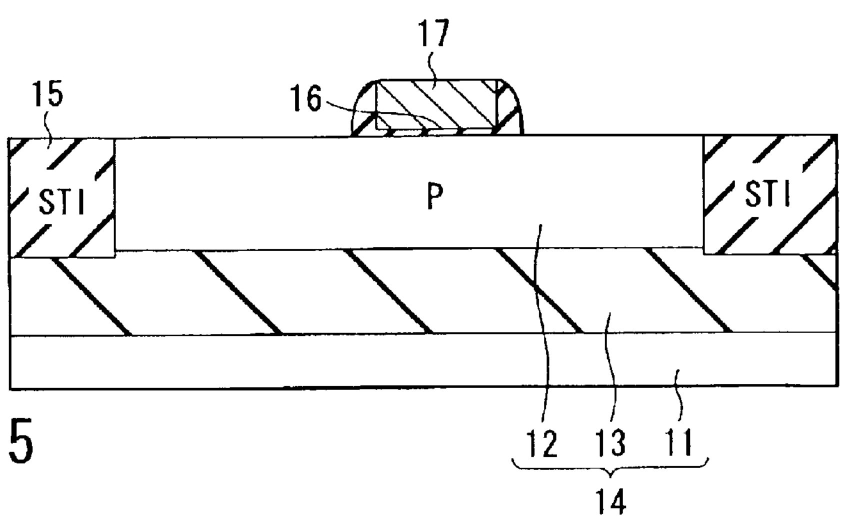
FIGS. 5, 6 and 7 are cross-sectional views illustrating fabrication steps of the magnetic memory device according to the first embodiment of the invention.
Figure 6:
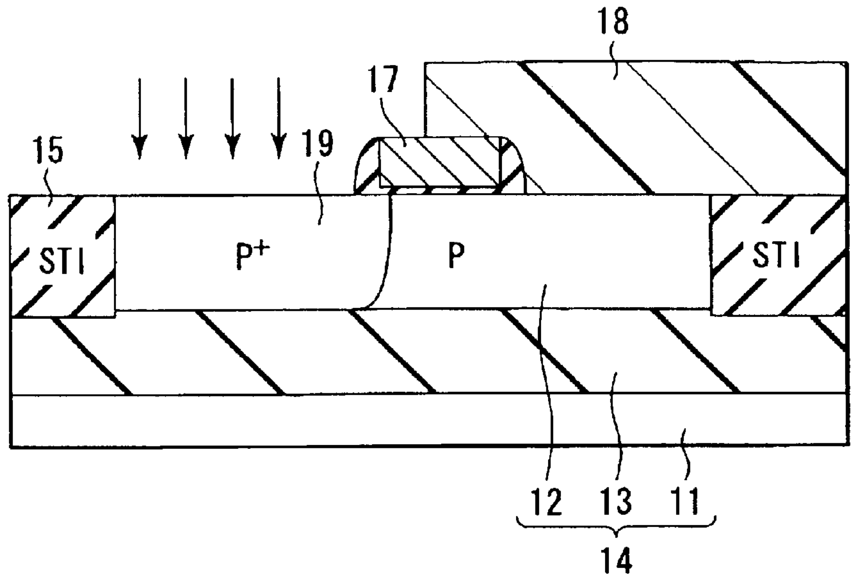
Figure 7:
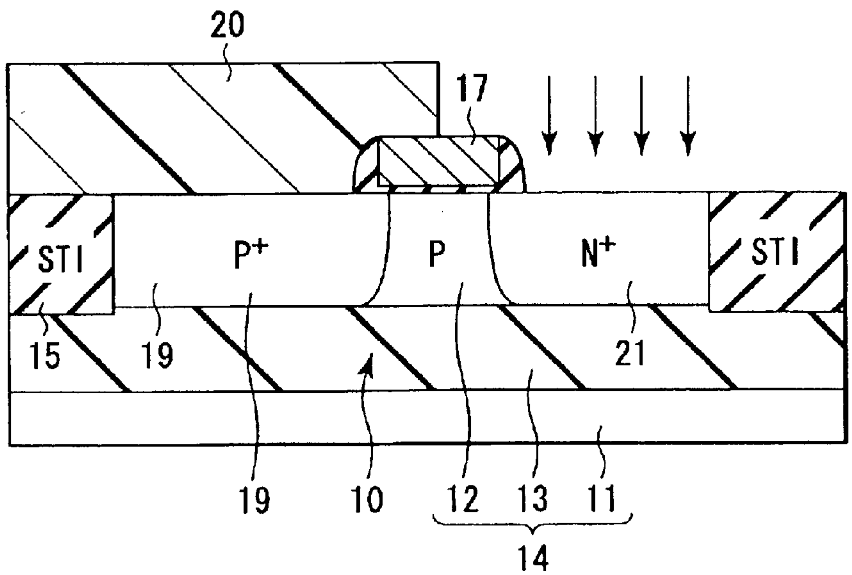

FIGS. 5, 6 and 7 are cross-sectional views illustrating fabrication steps of the magnetic memory device according to the first embodiment of the invention. A process of manufacturing the magnetic memory device according to the first embodiment will now be described.

As is shown in FIG. 5, an SOI substrate 14 is prepared. The SOI substrate 14 comprises, for example, a P type first semiconductor layer 11, a second semiconductor layer 12 and a buried oxide film 13 formed of, e.g. a silicon oxide film. Device isolation regions 15 of an STI (Shallow Trench Isolation) structure are selectively formed from a surface of the second semiconductor layer 12 to a depth reaching the buried oxide film 13. Then, ion implantation and thermal diffusion is effected in the second semiconductor layer 12, and thus the second semiconductor layer 12 of, e.g. P type, is formed. Alternatively, the second semiconductor layer 12 may be of N type. A gate electrode 17 is selectively formed on the second semiconductor layer 12, with a gate insulating film 16 interposed.

Subsequently, as shown in FIG. 6, a photoresist 18 is coated on the gate electrode 17 and second semiconductor layer 12, and the photoresist 18 is patterned as desired. Using the photoresist 18 as a mask, ion implantation and thermal diffusion are effected in the second semiconductor layer 12. Thereby, a $P^+$ type first diffusion layer 19 is formed in that region of the second semiconductor layer 12, which is located near one end of the gate electrode 17. The photoresist 18 is then removed.

As is shown in FIG. 7, a photoresist 20 is coated on the gate electrode 17 and second semiconductor layer 12, and the photoresist 20 is patterned as desired. Using the photoresist 20 as a mask, ion implantation and thermal diffusion are effected in the second semiconductor layer 12. Thereby, a $N^+$ type second diffusion layer 21 is formed in that region of the second semiconductor layer 12, which is located near the other end of the gate electrode 17. Thereafter, the photoresist 20 is removed.

Following the above steps, an insulating film 22 is formed on the gate electrode 17, second semiconductor layer 12 and element isolation regions 15, as shown in FIG. 1. Using publicly known art, first to fourth contacts 23*a*, 23*b*, 25, 27 and 29 and first to third wirings 24*a*, 24*b*, 26, 28*a* and 28*b* are formed within the insulating film 22. The first to fourth contacts 23*a*, 25, 27 and 29 and first to third wirings 24*a*, 26 and 28*a* are connected to the first diffusion layer 19. The first contact 23*b* and first wiring 24*b* are connected to the second diffusion layer 21. The third wiring 28*b* functions as write word line. A lower electrode 30 is provided on the fourth contact 29. An MTJ element 31 is formed on that part of the write word line 28*b*, which is located above the write word line 28*b*. A bit line 32 is formed on the MTJ element 31.

Either the first diffusion layer 19 or the second diffusion layer 21 may be first formed. Thus, alternatively, the second diffusion layer 21 may be first formed.

According to the first embodiment, the diode 10 is formed using the SOI substrate 14. Thus, the second semiconductor layer 12 is surrounded by the buried oxide film 13 (located below the second semiconductor layer 12) and the element isolation regions 15 in each cell. Hence, each cell is electrically isolated from adjacent cells by the buried oxide film 13 and element isolation regions 15. Therefore, unlike the prior art, there is no need to adjust the depth of the first and second diffusion layers 19 and 21 for electrical isolation from adjacent cells, and a variance in diode characteristics can be suppressed.

In the case where the diode 10 is formed using the SOI substrate 14, the first and second diffusion layers 19 and 21 do not extend to adjacent cells while the ion implantation and thermal diffusion are being carried out in forming these first and second diffusion layers 19 and 21. Therefore, there is no need to keep a long distance between adjacent cells, and thus the memory cell size can be reduced.

It is preferable that the first and second diffusion layers 19 and 21 be formed with a predetermined distance X kept therebetween. If the first and second diffusion layers 19 and 21 are formed to contact each other, a PN junction would be created at the interface thereof and a leak current would flow. The distance X between the first and second diffusion layers 19 and 21 may be, for example, equal to a width Y of the gate electrode 17. If reduction in area occupied by the memory cell region is taken into account, it is preferable that the distance X be about ½ of the width Y of gate electrode 17. In order to make the distance X between the first and second diffusion layers 19 and 21 less than the width Y of the gate electrode 17, as mentioned above, the following method can be adopted: to form the first and second diffusion layers 19 and 21 before forming a side-wall insulating film on a side wall of the gate electrode 17 by adjusting the time for heat treatment, and then to form the side-wall insulating film on the side wall of the gate electrode 17.

In the first embodiment, the second semiconductor layer 12 is of the P type. Alternatively, it may be of the N type. It should suffice if the impurity concentration in the second semiconductor layer 12 is set to be lower than that in the first diffusion layer 19 or second diffusion layer 21.

[Second Embodiment]

In a second embodiment of the present invention, the potential of the gate electrode formed on the SOI substrate is made variable. As regards the second embodiment, only differences from the first embodiment will be described.

Figure 8:
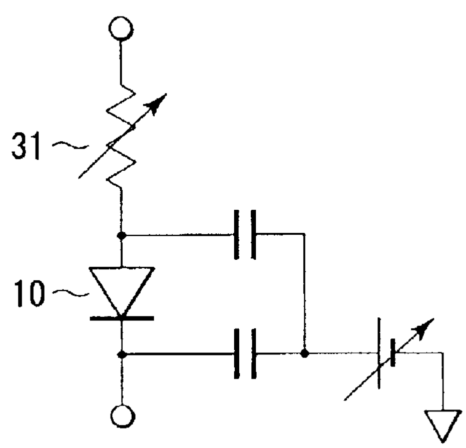
FIG. 8 is a circuit diagram showing a magnetic memory device according to a second embodiment of the invention.

FIG. 8 is a circuit diagram of a magnetic memory device according to the second embodiment of the invention. As is shown in FIG. 8, the second embodiment differs from the first embodiment in that the potential of the gate electrode is made variable. Specifically, where the second semiconductor layer 12, which will serve as a channel region, is a P type diffusion layer, a negative gate voltage is applied to the gate electrode 17. On the other hand, where the second semiconductor layer 12, which will serve as a channel region, is an N type diffusion layer, a positive gate voltage is applied to the gate electrode 17. The reason why the potential of the gate electrode 17 is made variable will be explained below.

The first embodiment employs a diode 10 with a diode structure, which is generally called a "gate control" diode structure. The I–V characteristics of the diode 10 will vary depending on the gate voltage. This phenomenon is caused by an interface level that is present under the gate electrode 17. Normally, a depletion layer is created under the gate electrode 17 in accordance with a voltage applied to the gate electrode 17. In this case, if an interface level is present in the depletion layer, the interface level functions as a center of junction and a reverse bias current is caused to flow. In general terms, the higher the gate voltage on the positive side, the greater the width of the depletion layer and the higher the reverse bias current.

In the case where the second semiconductor layer 12, which will function as the channel region under the gate electrode 17, is the P type diffusion layer, as shown in FIG. 1 (the first embodiment), a PN junction between the $N^+$ type second diffusion layer 21 and the P type second semiconductor layer 12 will be a problem. In order to prevent the occurrence of a reverse bias current due to the interface level, it should suffice to set the gate voltage to have a negative value. On the other hand, where the second semiconductor layer 12, which will function as the channel region under the gate electrode 17, is the N type diffusion layer, it should suffice if the gate voltage is set to have a positive value. In the second embodiment, in order to prevent the occurrence of a reverse bias current due to the interface level, the potential of the gate electrode 17 is made variable in this manner.

According to the second embodiment, the same advantages as with the first embodiment can be obtained.

Furthermore, the gate voltage to be applied to the gate electrode 17 is selectively set to have a positive value or a negative value in accordance with the conductivity type of the second semiconductor layer 12 functioning as the channel region. Thereby, the occurrence of the reverse bias current due to the interface level can be prevented.

[Third Embodiment]

A third embodiment of the invention relates to a structure wherein an SOI substrate is used for the memory cell array region and a bulk substrate is used for the peripheral circuit region. As regards the third embodiment, only differences from the first embodiment will be explained.

Figure 9A:
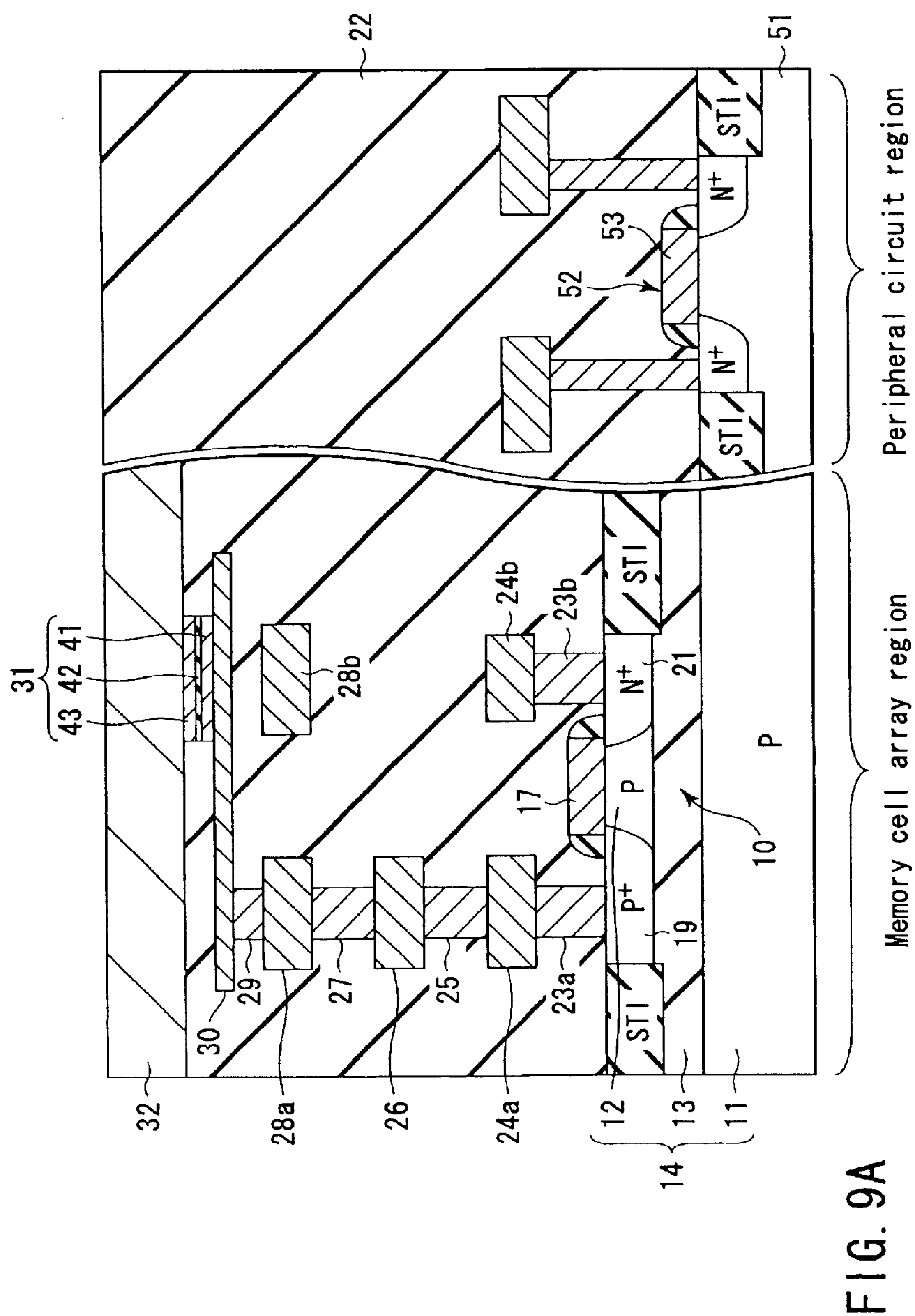
FIGS. 9A and 9B are cross-sectional views showing a magnetic memory device according to a third embodiment of the invention.
Figure 9B:
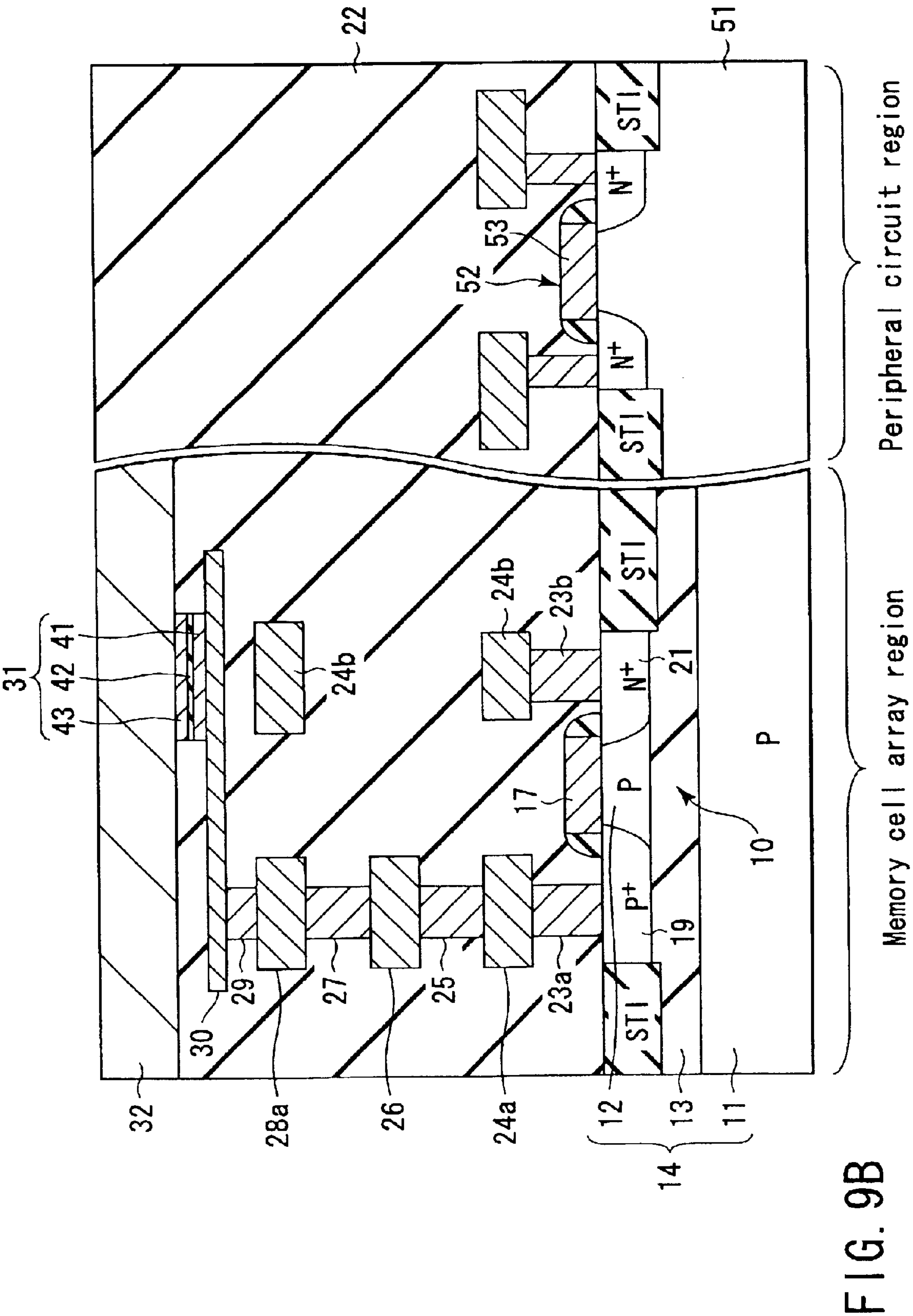

FIGS. 9A and 9B are cross-sectional views showing a magnetic memory device according to a third embodiment of the invention. As is shown in FIG. 9, in the magnetic memory device according to the third embodiment, the SOI substrate 14 is not used for both the memory cell array region and peripheral circuit region. A bulk substrate 51 is used for the peripheral circuit region alone. Specifically, in the memory cell array region, like the first embodiment, the diode 10 is formed using the SOI substrate 14. On the other hand, in the peripheral circuit region, the bulk substrate 51 is used and a peripheral transistor 52 is formed on the bulk substrate 51.

As shown in FIG. 9A, the surface of the bulk substrate 51 is substantially on a level with the surface of the first semiconductor layer 11 of SOI substrate 14. Accordingly, there is a stepped portion at a boundary between the memory cell array region and peripheral circuit region, and the level of the gate electrode 17 in the memory cell array region differs from that of a gate electrode 53 in the peripheral circuit region.

As shown in FIG. 9B, the surface of the bulk substrate 51 is substantially on a level with the surface of the second semiconductor layer 12 of SOI substrate 14. Accordingly, there is not the stepped portion at the boundary between the memory cell array region and peripheral circuit region, and the gate electrode 17 in the memory cell array region is substantially on a level with the gate electrode 53 in the peripheral circuit region.

FIGS. 10A through 11C are cross-sectional views illustrating fabrication steps of the magnetic memory device according to the third embodiment of the invention. Two methods for fabricating the SOI substrate in the memory cell array region alone will now be described.

Figure 10A:
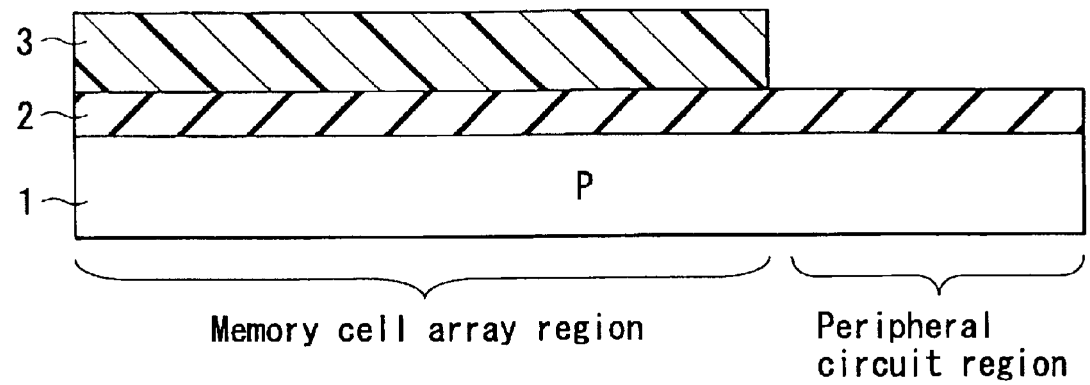
FIGS. 10A, 10B and 10C are cross-sectional views illustrating fabrication steps of a first method for fabricating the magnetic memory device according to the third embodiment of the invention.
Figure 10B:
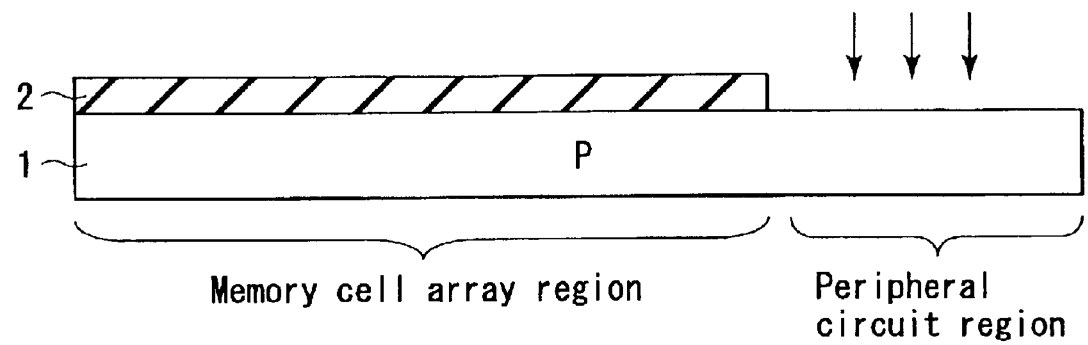
Figure 10C:
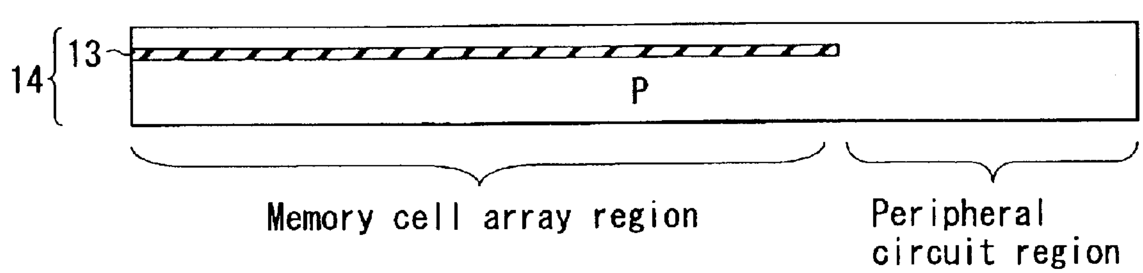

The steps of a first method will first be described referring to FIGS. 10A, 10B and 10C. As is shown in FIG. 10A, a silicon oxide film 2 serving as a mask layer is provided on, e.g. a P type silicon substrate 1 in the memory cell array region and peripheral circuit region. A photoresist 3 is formed on the silicon oxide film 2, and it is patterned so as to remain only in the memory cell array region. Next, as shown in FIG. 10B, using the photoresist 3 as a mask, the silicon oxide film 2 is selectively etched, following which the photoresist 3 is removed. Using the silicon oxide film 2 as a mask, $O^+$ ions, for instance, are implanted only in the peripheral circuit region. Thereafter, the silicon oxide film 2 is removed. Then, as shown in FIG. 10C, a buried oxide film 13 is formed in the memory cell array region alone by annealing. Thus, the SOI substrate 14 is formed.

Figure 11A:
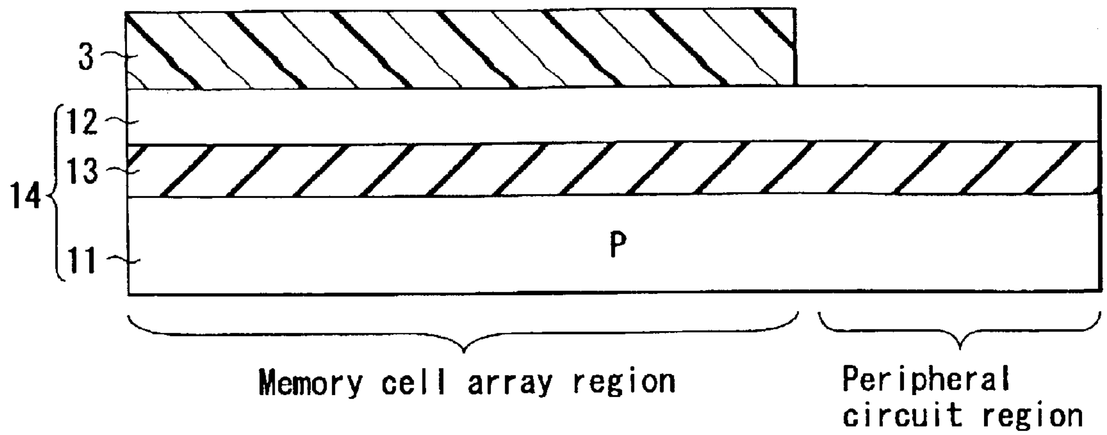
FIGS. 11A, 11B, 11C, 11D, 11E and 11F are cross-sectional views illustrating fabrication steps of a second method for fabricating the magnetic memory device according to the third embodiment of the invention.
Figure 11B:
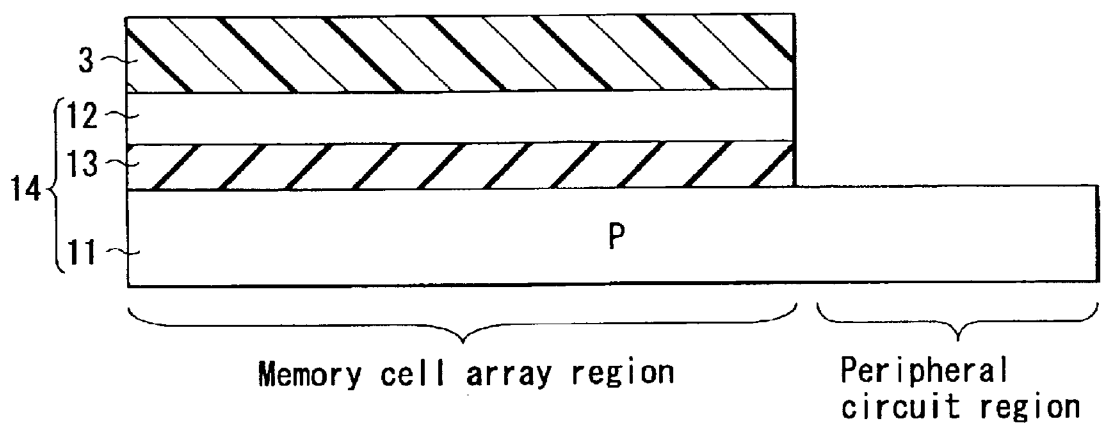
Figure 11C:
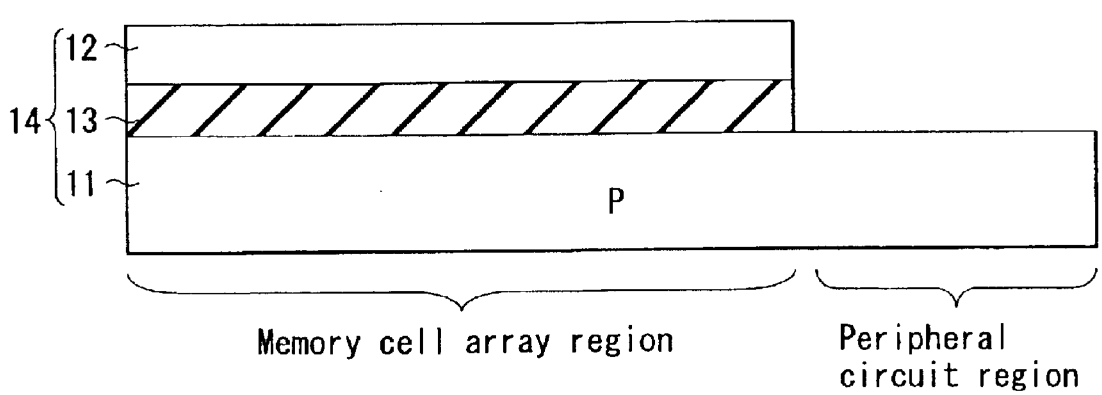

The steps of a second method will now be described referring to FIGS. 11A, 11B and 11C. As is shown in FIG. 11A, an SOI substrate 14 is formed, which comprises first and second semiconductor layers 11 and 12 and a buried oxide film 13 formed between the first and second first and second semiconductor layers 11 and 12. A photoresist 3 is formed on the second semiconductor layer 12, and it is patterned to remain only in the memory cell array region. Using the photoresist 3 as a mask, as shown in FIG. 11B, the second semiconductor layer 12 and buried oxide film 13 in the peripheral circuit region are etched. Then, as shown in FIG. 11C, the photoresist 3 is removed. The SOI substrate 14 is thus left only in the memory cell array region.

Figure 11D:
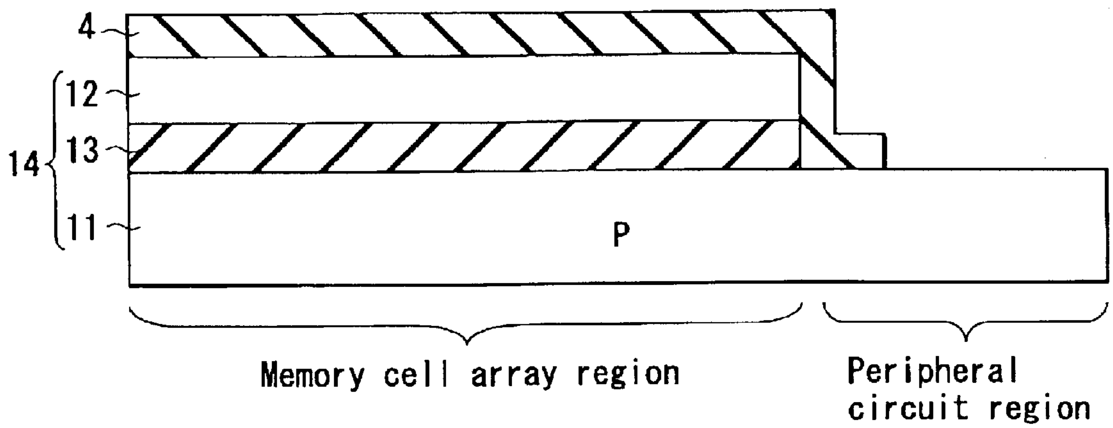
Figure 11E:
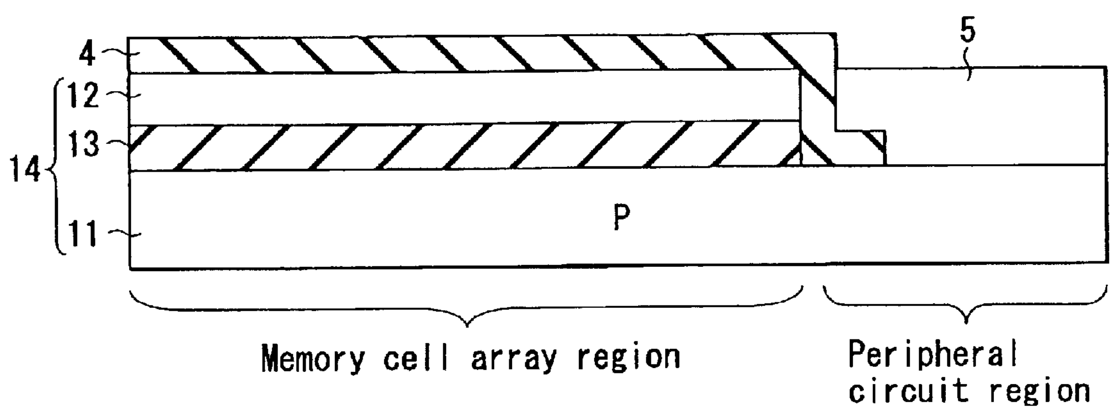
Figure 11F:
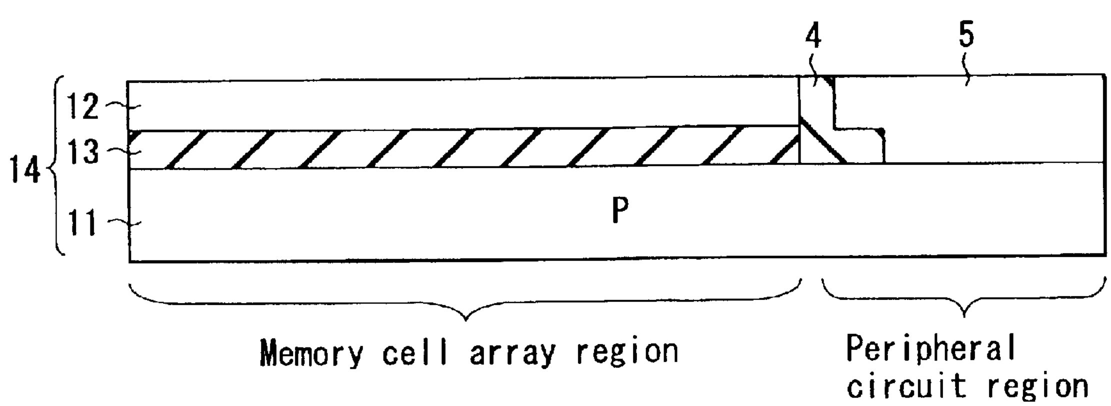

Following the step of FIG. 11C, the stepped portion between the memory cell array region and peripheral circuit region may be eliminated by the following method. For example, as shown in FIG. 11D, a silicon nitride film 4 is deposited on the entire surface of the memory cell array region and peripheral circuit region, and only that portion of the silicon nitride film 4, which lies on the peripheral circuit region, is removed by a lithography technique. Then, as shown in FIG. 11E, Si on the exposed surface is selectively grown up to a level substantially corresponding to the surface level of the second semiconductor layer 12 by means of selective epitaxial growth (SEG). Thereby, an epitaxial growth layer 5 is formed in the peripheral circuit region. The silicon nitride film 4 on the second semiconductor layer 12 is removed, as shown in FIG. 11F.

According to the third embodiment, the following advantage as well as the advantages of the first embodiment can be obtained.

In general, a body contact needs to be added to a transistor in a CMOS circuit formed on the SOI substrate 14. The provision of the body contact will disadvantageously increase the chip area. In the third embodiment, however, the SOI substrate 14 is used for the memory cell array region, but the bulk substrate 51 is used for the peripheral circuit region. As a result, there is no need to add a body contact to the peripheral transistor 52, and the chip area can be reduced, compared to the case where the SOI substrate is used for both the memory cell array region and peripheral circuit region.

The voltage to be applied to the gate electrode of the memory cell array region according to the third embodiment may be made variable, similarly with the second embodiment. In this case, the same advantages as with second and third embodiments can be obtained.

[Fourth Embodiment]

In the first to third embodiments, double-axis data write using write word lines and bit lines is performed. By contrast, in a fourth embodiment, single-axis data write using bit lines alone is performed.

Figure 12:
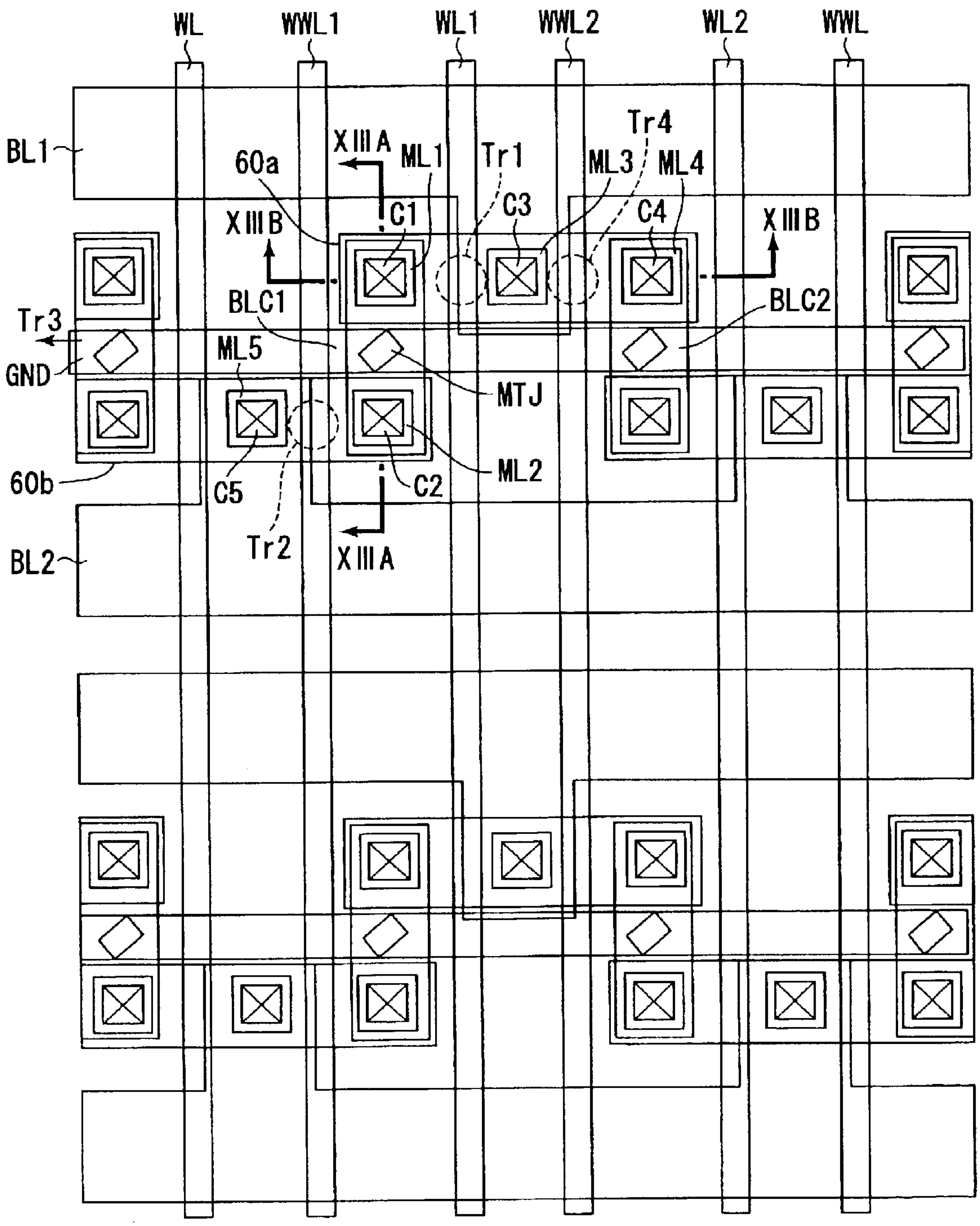
FIG. 12 is a plan view of a magnetic memory device according to a fourth embodiment of the invention.
Figure 13A:
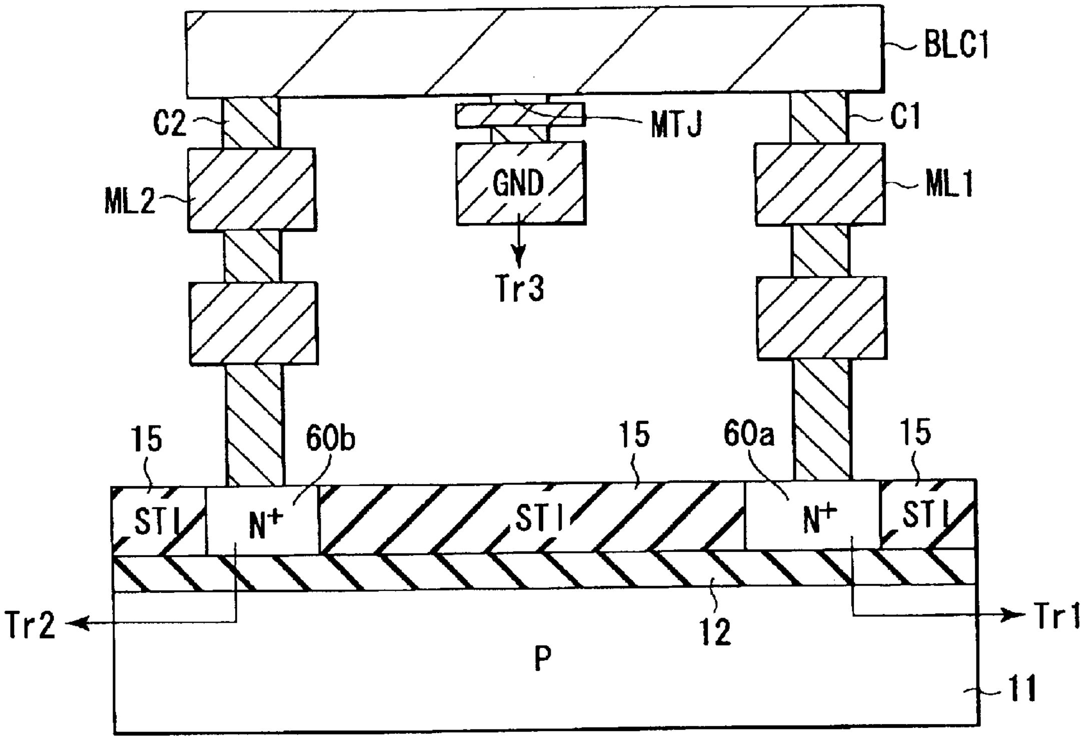
FIG. 13A is a cross-sectional view of the magnetic memory device, taken along line XIIIA—XIIIA in FIG. 12.
Figure 13B:
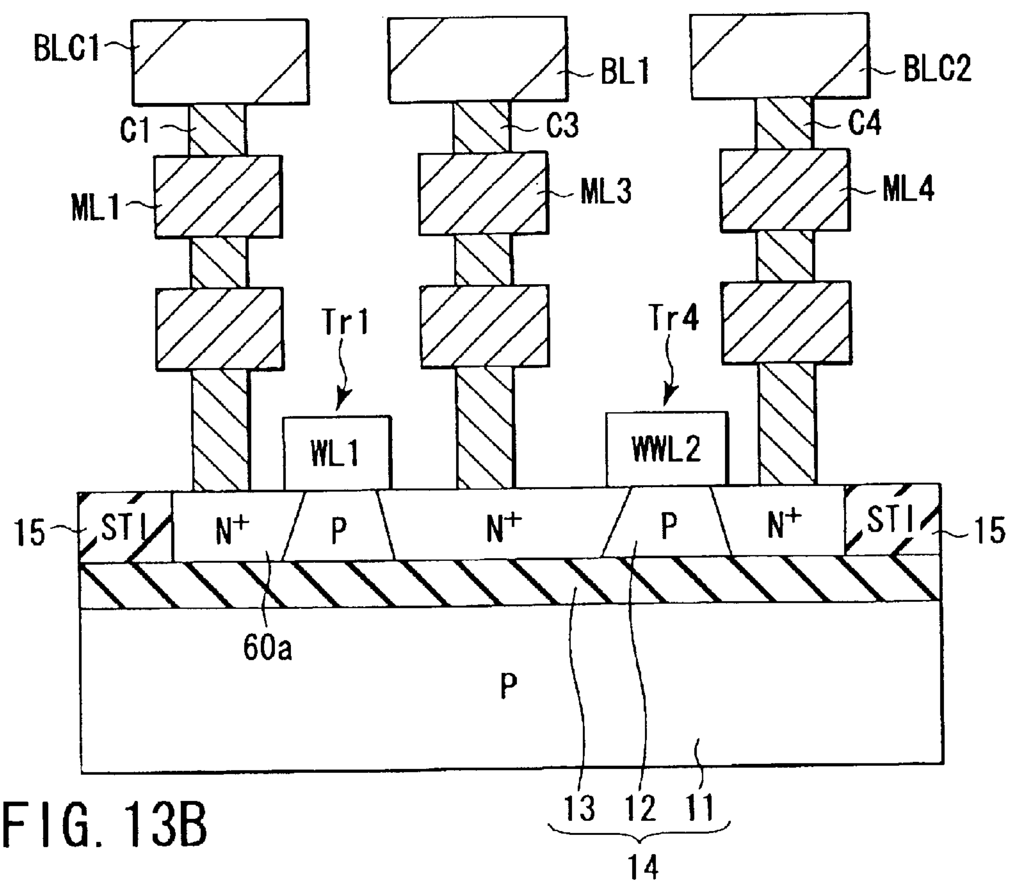
FIG. 13B is a cross-sectional view of the magnetic memory device, taken along line XIIIB—XIIIB in FIG. 12.
Figure 14:
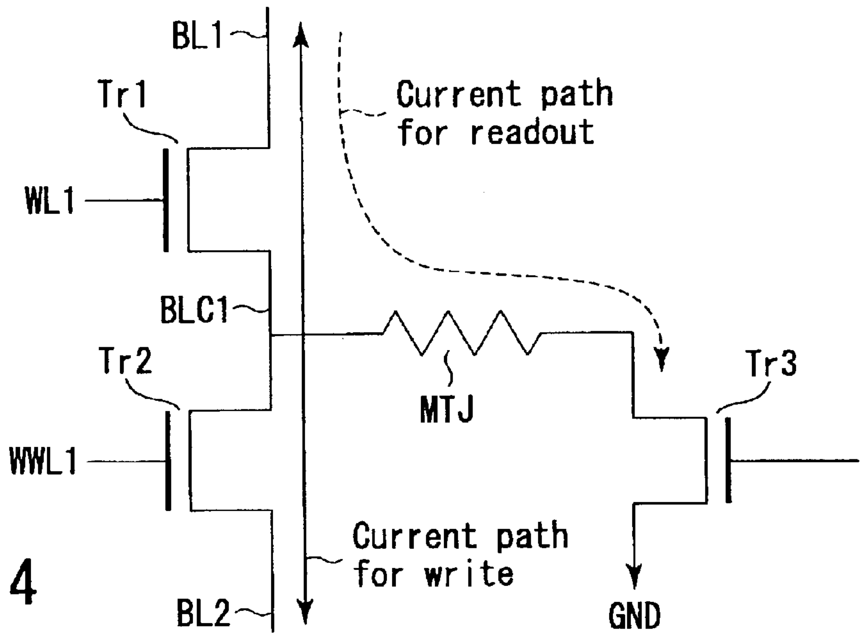
FIG. 14 is a circuit diagram of the magnetic memory device according to the fourth embodiment of the invention.
Figure 15A:
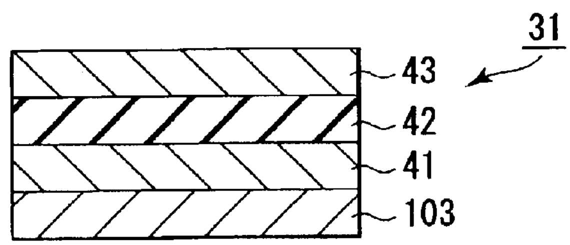
FIGS. 15A, 15B and 15C are cross-sectional views showing a prior-art MTJ element.
Figure 15B:
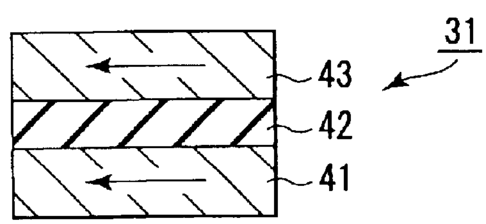
Figure 15C:
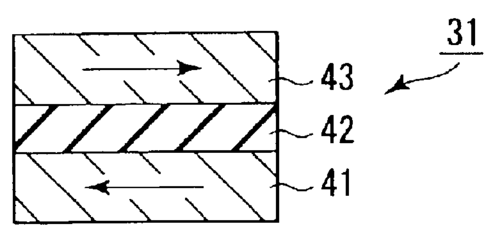
Figure 16:
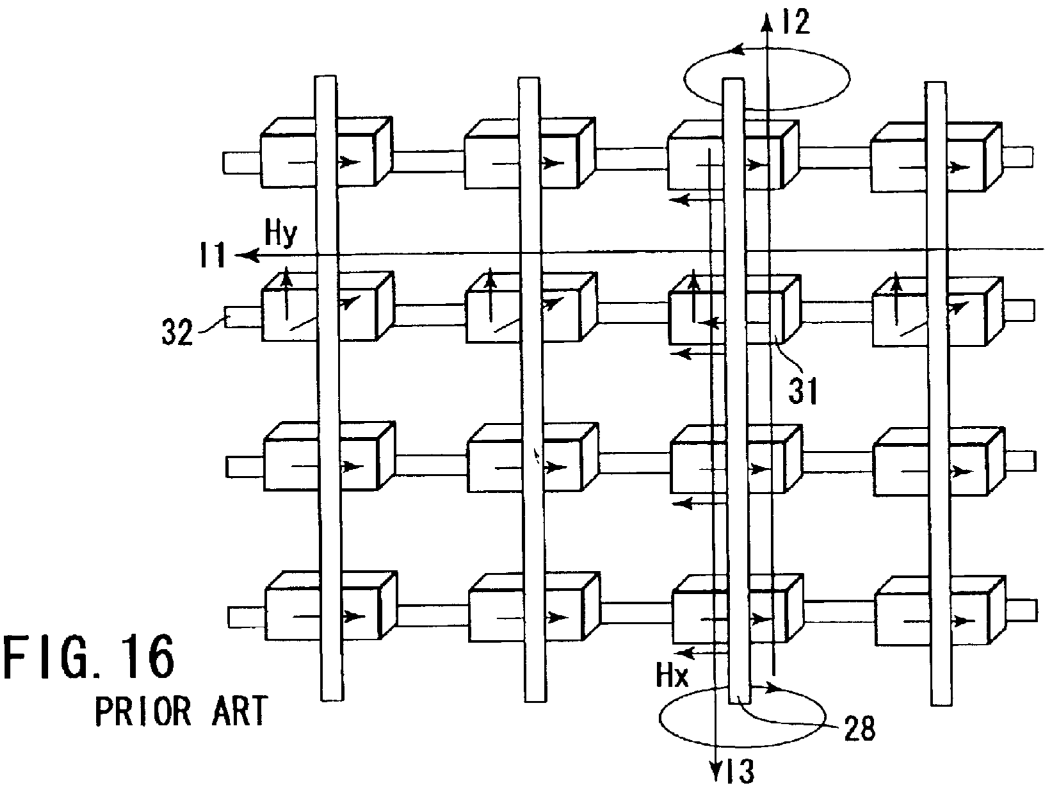
FIG. 16 shows MTJ elements arranged in a matrix in the prior-art magnetic memory device.
Figure 17:
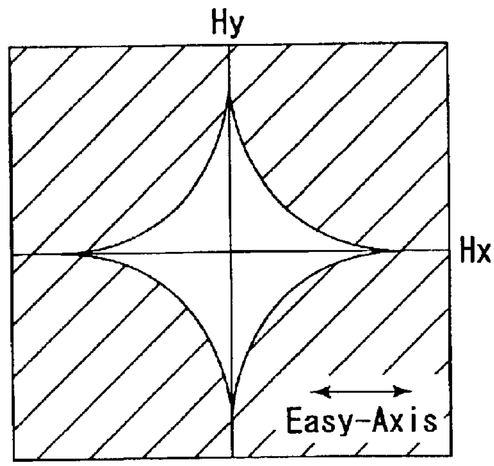
FIG. 17 shows asteroid curves relating to the prior-art magnetic memory device.
Figure 18:
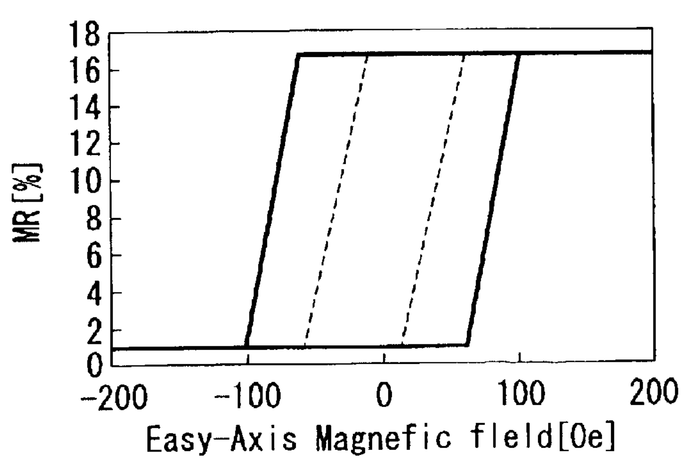
FIG. 18 shows MTJ curves relating to the prior-art magnetic memory device.
Figure 19:
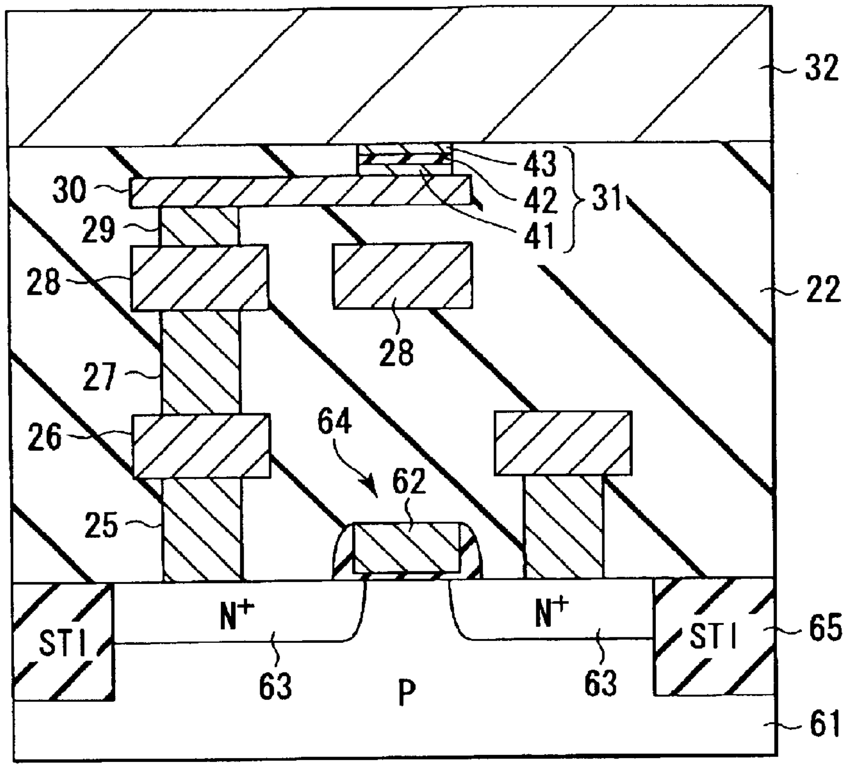
FIG. 19 is a cross-sectional view of a prior-art magnetic memory device having a transistor.
Figure 20:
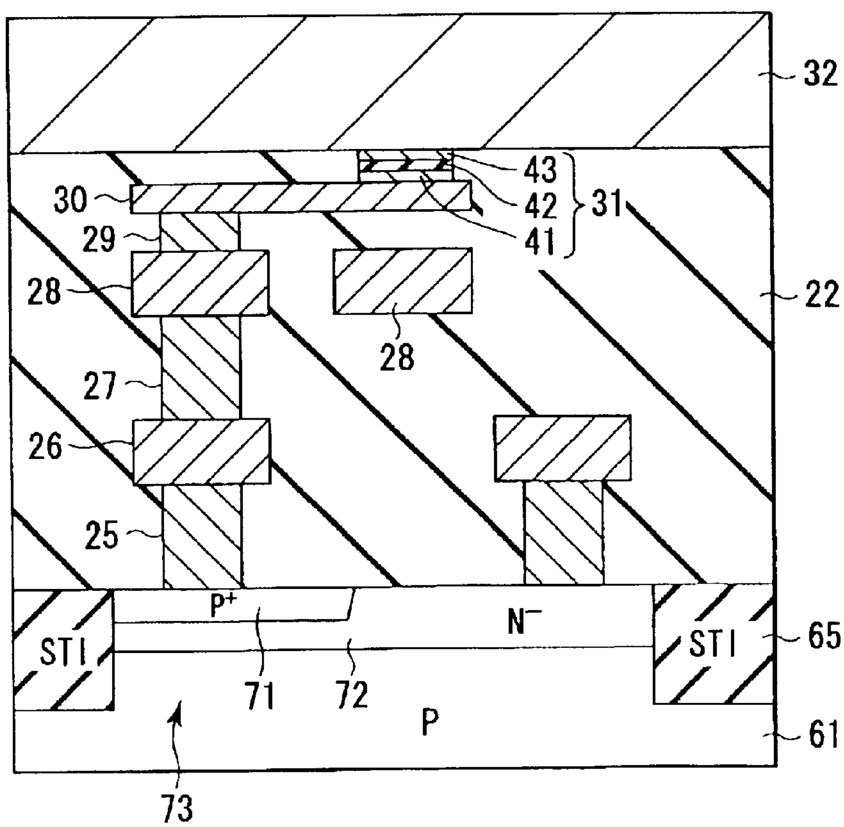
FIG. 20 is a cross-sectional view of a prior-art magnetic memory device having a diode.

FIG. 12 is a plan view of a magnetic memory device according to the fourth embodiment of the invention. FIG. 13A is a cross-sectional view of the magnetic memory device, taken along line XIIIA—XIIIA in FIG. 12. FIG. 13B is a cross-sectional view of the magnetic memory device, taken along line XIIIB—XIIIB in FIG. 12. FIG. 14 is a circuit diagram of the magnetic memory device according to the fourth embodiment of the invention. As regards the fourth embodiment, only differences in structure from the first embodiment will be described.

As is shown in FIGS. 12, 13A, 13B and 14, a memory cell in the magnetic memory device according to the fourth embodiment is composed of an MTJ element, transistors Tr1 and Tr2 for data write, a transistor Tr3 for data read-out, and bit lines BL1, BL2 and BLC1.

Specifically, two transistors Tr1 and Tr2, which are switching elements for data write, are formed on the SOI substrate 14.

The gate electrode of the transistor Tr1 functions as a data read-out/write word line WL1. One of the diffusion layers of the transistor Tr1 is connected to the bit-line connection wiring BLC1 via a metal wiring ML1, a contact C1, etc. The other diffusion layer of transistor Tr1 is connected to the bit line BL1 via a metal wiring ML3, a contact C3, etc.

The gate electrode of the transistor Tr2 functions as a write word line WWL1. One of the diffusion layers of the transistor Tr2 is connected to the bit-line connection wiring BLC1 via the metal wiring ML2, contact C2, etc. The other diffusion layer of transistor Tr2 is connected to the bit line BL2 via a metal wiring ML5, a contact C5, etc.

The MTJ element is connected at one end to the bit-line connection wiring BLC1, and at the other end to a ground (GND) line. The transistor Tr3, which is a switching element for data read-out, may be connected to the MTJ element.

In this embodiment, a single write wiring is used. Thus, the direction of magnetization is made easily reversible by shifting the angle of intersection between the direction of extension of the bit-line connection wiring BLC1, which is the write wiring, and the magnetization direction of the MTJ element, by a certain degree (e.g. 45°) from 90°.

In the single-axis data write magnetic memory device, as described above, the data write/read operations are performed as follows.

When data is to be written in the MTJ element, the word line WL1 and write word line WWL1, which are the gate electrodes of the transistors Tr1 and Tr2 of the selected cell, are turned on. A write current is let to flow from the bit line BL1 to the bit line BL2, or vice versa. A magnetic field produced by the write current changes the magnetization direction of the recording layer of the MTJ element. The direction of current may be chosen in accordance with the magnetization direction to be changed. During the write operation, the transistor Tr3 connected to the common GND line is turned off, thereby to prevent the write current from flowing to the MTJ element.

On the other hand, when data is to be read out of the MTJ element, the word line WL1 of the transistor Tr1 of the selected cell is turned on, and all the write word lines WWL1, 2, . . . , are turned off. A read-out current is let to flow from the bit line BL1 to the ground GND via the MTJ element, and the data is read by a sense amplifier connected to the bit line BL1. During the read-out operation, the transistor Tr3 connected to the common GND line is turned on.

According to the fourth embodiment, the following advantage, as well as the advantages of the first embodiment, can be obtained.

In the case of the structure for double-axis data write using write word lines and bit lines, a plurality of bit lines and word lines are provided in a matrix and MTJ elements are disposed at intersections of the bit lines and word lines. In the write operation, data write is effected not only on one MTJ element located at the intersection of the selected bit line and selected word line, but also on an MTJ element located below the selected bit line or above the selected word line. In short, in the case of the double-axis data write, there is a possibility of erroneous write in a semi-selected cell.

By contrast, in the fourth embodiment, the transistors Tr1 and Tr2 are arranged so that a current may flow to only the bit lines BL1 and BL2 in the data write operation. Hence, a write current does not flow to cells other than the selected cell, and there is no semi-selected cell. Therefore, a disturb defect (data retention defect) in a semi-selected cell can be prevented.

In the first to third embodiments, the diode is used as a switching element, but the diode may be replaced with a transistor. In the fourth embodiment, diodes may be substituted for the transistors Tr1, Tr2 and Tr3.

In the first to fourth embodiments, the MTJ element is used as a memory element. Alternatively, the MTJ element may be replaced with a GMR (Giant Magneto-Resistive) element comprising two magnetic layers and a conductive layer interposed therebetween.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:

an SOI substrate having a first semiconductor layer, a first insulating film formed on the first semiconductor layer, and a second semiconductor layer formed on the first insulating film;

an element isolation insulating film formed selectively in the second semiconductor layer and extending from a surface of the second semiconductor layer with a depth reaching the first insulating film;

a diode formed in the second semiconductor layer;

a magneto-resistive element connected to the diode;

a first wiring extending in a first direction at a distance below the magneto-resistive element; and a second wiring formed on the magneto-resistive element and extending in a second direction different from the first direction, wherein the diode comprises:

a gate electrode formed on the second semiconductor layer with a gate insulating film interposed;

a first diffusion layer of a first conductivity type that is formed in a portion of the second semiconductor layer, which is located near one end of the gate electrode, the first diffusion layer being concentrated to the magneto-resistive element; and a second diffusion layer of a second conductivity type that is formed in a portion of the second semiconductor layer, which is located near the other end of the gate electrode.

2. A magnetic memory device according to claim 1, wherein the second diffusion layer is spaced apart from the first diffusion layer.

3. A magnetic memory device according to claim 1, wherein a distance between the first and second diffusion layers is substantially equal to a width of the gate electrode.

4. A magnetic memory device according to claim 1, wherein a distance between the first and second diffusion layers is ½ of a width of the gate electrode.

5. A magnetic memory device according to claim 2, wherein the second semiconductor layer lying between the first diffusion layer and the second diffusion layer is a third diffusion layer of the first conductivity type or the second conductivity type.

6. A magnetic memory device according to claim 5, wherein the third diffusion layer has an impurity concentration lower than an impurity concentration of the first diffusion layer or the second diffusion layer.

7. A magnetic memory device according to claim 1, wherein a potential to be applied to the gate electrode is fixed.

8. A magnetic memory device according to claim 1, wherein a potential to be applied to the gate electrode is fixed at a ground potential level.

9. A magnetic memory device according to claim 1, wherein the magneto-resistive element is an MTJ element comprising at least a first magnetic layer, a second magnetic layer and a non-magnetic layer.

10. A magnetic memory device according to claim 9, wherein the MTJ element has a single junction structure having one said non-magnetic layer, or a double junction structure having two said non-magnetic layers.

* * * * *